United States Patent [19]

Mednik

[11] Patent Number: 5,841,268
[45] Date of Patent: Nov. 24, 1998

[54] MULTI-RESONANT SOFT SWITCHING SNUBBER NETWORK FOR DC-TO-DC CONVERTER

[75] Inventor: Alexander Mednik, Campbell, Calif.

[73] Assignee: Power Architects Corporation, Campbell, Calif.

[21] Appl. No.: 939,929

[22] Filed: Sep. 29, 1997

[51] Int. Cl.⁶ ..................................................... G05F 1/56
[52] U.S. Cl. ............................................ 323/222; 323/235
[58] Field of Search ................................. 323/220, 222, 323/259, 282, 235, 290, 319, 352, 354

[56] References Cited

U.S. PATENT DOCUMENTS

| | | | |
|---|---|---|---|
| 5,307,005 | 4/1994 | Ahaldas et al. ........................... | 323/222 |
| 5,313,382 | 5/1994 | Farrington ............................ | 323/222 X |
| 5,418,704 | 5/1995 | Hua et al. ............................. | 363/222 X |
| 5,434,767 | 7/1995 | Batarseh et al. ...................... | 323/222 X |
| 5,461,302 | 10/1995 | Garcia et al. ............................ | 323/222 |
| 5,488,269 | 1/1996 | El-Hamamsy et al. ................. | 315/307 |
| 5,543,704 | 8/1996 | Thoren et al. ........................... | 323/222 |
| 5,548,503 | 8/1996 | Motonobu et al. ....................... | 363/56 |
| 5,550,458 | 8/1996 | Farrington et al. ..................... | 323/222 |
| 5,633,579 | 5/1997 | Kim ....................................... | 323/222 |
| 5,636,114 | 6/1997 | Bhagwat et al. .......................... | 363/56 |
| 5,654,626 | 8/1997 | Karlsson .................................. | 323/222 |

OTHER PUBLICATIONS

J.Bazinet and J.O'Connor, "Analysis and Design of Zero Voltage Transition Power Factor Correction Circuit", IEEE Applied Power Electronics Conference, Feb. 1994, pp. 591–597.

J.P.Noon, "A 250kHz , 500W Power Factor Correction Circuit Employing Zero Voltage Transitions", Unitrode Power Supply Design Seminar Manual SEM1000, 1994, pp.(1–1)–(1–15).

*Primary Examiner*—Peter S. Wong
*Assistant Examiner*—Y. J. Han

[57] ABSTRACT

A family of DC-to-DC converters includes a multi-resonant snubber network connected in parallel with a power switching device. The multi-resonant snubber network includes an auxiliary switch that is connected to transfer the energy from a parasitic capacitance of the power switching device into a resonant inductor and to achieve zero-voltage turn-on of the power switching device. An additional resonant path is included in the snubber network to achieve zero-voltage turn-off of the auxiliary switch and the power switching device.

18 Claims, 4 Drawing Sheets

MULTI-RESONANT SOFT SWITCHING SNUBBER NETWORK FOR DC-TO-DC CONVERTER

BACKGROUND OF THE INVENTION

1. Field of the Invention

The present invention relates to DC-to-DC converters which process power from an input DC voltage source delivering DC power to a load by means of an inductive energy storage element being selectively connected to the input source and the load via electronic solid state switches. More specifically, the present invention concerns the DC-to-DC converters employing an actively switched snubber circuit reducing switching power losses in the switching elements of the converter.

2. Description of Related Art

Being a power processing apparatus, a DC-to-DC converter operates to convert an input direct current (DC) voltage into an output direct current voltage. The converter in which a power inductor is alternately connected to an input DC source to store magnetic field energy and then, in series with the input source, to a load to transfer the stored energy is called a boost converter. Although the present invention equally applies to many other types of DC-to-DC converters, the boost converter is the most frequent application for lossless snubber circuits. For this reason, the boost topology is chosen as an example to demonstrate advantages of the present invention.

DC to DC converters of boost topology have become an attribute of nearly every modern medium and high power off-line power system. This occurred due to the modern requirement of maximum permissible values of harmonic components of the input current that may be produced by such power system. To meet this requirement special input preregulators are utilized. These circuits that are commonly referred as active power factor correctors (PFC) force the input current to follow the input voltage waveform.

Boost topology is the most commonly used for this application due to the fact that it comprises an inductor at it's input. This fact allows to control input current of the power supply directly and to minimize conducted emission of the switching noise in the AC mains. However, this topology by itself presents a serious disadvantage of high switching power losses. Since the circuit is usually designed to accommodate wide input voltage range, usually, it operates at very high conversion ratio. This forces a designer to use multiple low Rdc(on) switching MOSFETs exhibiting very large drain-to-source capacitance Coss. Although it helps to reduce dV/dt on turn-off and minimise switching loss at this transition, it presents a serious problem on turn-on since the energy stored in Coss is fully dissipated in the MOSFETs. Another major source of switching power losses is related to reverse recovery transition in the rectifier device. These losses become very substantial at high output voltage of the converter combined with large input current which occurs at low input line voltage. These facts become a limiting factor of attainable switching frequency.

To reduce reverse recovery power loss in the rectifier device, prior art brought forward numerous passive snubber networks producing very little power loss. However, to recirculate the energy stored in Coss of the switching MOSFET, an active controlled snubber circuit is needed. The circuits proposed by the prior art utilize a resonant active snubber network used to discharge Coss of the main switching MOSFETs prior to their turn-on. The electrostatic energy of Coss is, in a resonant way, stored in an auxiliary resonant inductor, and then recirculated in the output load. For this purpose, an auxiliary switching MOSFET is utilized.

The idea disclosed in these prior art publications can be demonstrated by a simplified circuit shown in FIG. 1. The circuit presents a boost converter 20 using an active snubber network 12. An input DC voltage source 1 is selectively connected to an inductor 2 via a controlled solid state switch 3. A diode 6 represent a built-in body diode of the switch 3. A capacitor 7 in parallel with the switch 3 represents parasitic output capacitance of the switch 3 combined with an additional resonant capacitor if necessary. A power diode 4 in series with an output filter capacitor 5 is connected in parallel with the switch 3. An active snubber network including a resonant inductor 9 coupled in series with an auxiliary controlled solid state switch 8 is connected in parallel with the power switch 3. A diode 17 is included in series with the switch 8. A capacitor 11 connected in parallel with the switch 8 represents parasitic output capacitance of the switch 8. An auxiliary diode 10 is, also, connected in series with the resonant inductor 9 and couples it in parallel with the power diode 4.

In operation, when the controlled solid state switches 3 and 8 are non-conductive, the diode 4 is forward biased conducting current of the input inductor 2 and transferring energy to the output. The capacitors 7 and 11 are charged to the output voltage value $V_{OUT}$ across the output filter capacitor 5. The current in the resonant inductor 9 is zero. The diode 10 is non-conductive. The body diode 6 is reverse biased to the output voltage $V_{OUT}$.

FIG. 2 represents the voltage $V_1$ waveform 21 across the power switch 3, the voltage $V_2$ waveform 22 across the auxiliary switch 8 connected in series with the diode 17 and the current $I_R$ waveform 23 in the resonant inductor 9. At the moment T1, the auxiliary switch 8 is biased conducted. This transition occurs at zero current, since there is no current in the resonant inductor 9. Therefore, power loss during this transition is limited to the energy stored in the output capacitance 11 of the switch 8 prior its turn-on. This capacitance is relatively small, since the power rating of the switch 8 is relatively low. The current $I_R$ in the resonant inductor 9 starts to increase linearly until, at the moment T2, it becomes equal to a sum of the current in the input inductor 2 and the reverse recovery current in the diode 4. During this stage the diode 4 softly recovers until it is reverse biased. Since the voltage across the diode 4 during this stage is close to zero, there is very little power dissipation in the diode 4 due to its reverse recovery. Starting the moment T2, the current in the inductor 9 increases resonantly in a sinusoidal way while the voltage across the switch 3 resonantly decreases to zero until, at the moment T3, the body diode 6 becomes forward biased. At this moment, the current $I_R$ in the resonant inductor 9 enters its free-wheeling stage, since the voltage across the inductor 9 is close to zero. To avoid excessive conduction power loss in the auxiliary switch 8, it can be biased none-conducting immediately after the inductor 9 current $I_R$ enters the free-wheeling stage. Meanwhile, the voltage $V_1$ across the power switch 3 is zero, since its body diode 6 is conductive. At the moment T4, the power switch 3 is turned on, and the auxiliary switch 8 is turned off. There is very little power dissipation in the switch 3 during this transition, since its output capacitance 7 is discharged. However, the turn-off transition of the auxiliary switch 8 presents a substantial source of switching power loss due to a large current in the resonant inductor 9.

The peak current in the resonant inductor 9 can be given by the equation:

$$I_{R(PK)}=I_L+I_{RR}+V_{OUT}(C_{R1}/L_R)^{1/2}, \qquad (1)$$

where $I_L$ is a current in the power inductor 2; $I_{RR}$ is a reverse recovery current in the boost diode 4; $V_{OUT}$ is the output voltage of the converter; $C_{R1}$ is a value of the capacitor 7; $L_R$ is a value of the resonant inductor 9. This current, as it can be seen from the equation (1), exceeds the current $I_L$ in the power inductor 2. It is, also, largely dependent on the impedance of the resonant tank $(L_R/C_{R1})^{1/2}$. To reduce turn-off losses in the switch 3, the value of the resonant capacitor 7 is, typically, quite substantial. In most applications, external capacitance is added in parallel with the switch 3 in order to reduce Miller effect in the switch 3. The value of the resonant inductor 9 is defined by a reverse recovery characteristic of the diode 4. However, the value of the inductor 9 is also limited by the minimum duty cycle $D_{min}$ (and, therefore, the minimum output voltage $V_{OUT\ (min)}$) necessary to reset the resonant inductor 9 to zero current. Thus, the peak resonant current $I_{R\ (PK)}$ in the inductor 9, necessary to achieve zero voltage condition across the switch 3, is almost double of the current in the input inductor 2. Since the output capacitance 11 of the switch 8 is relatively small, the large current in the inductor 9 causes a transition with extremely fast voltage $V_2$ slew rate across the switch 8. This transition may cause increased switching losses in the switch 8 as well as a potential parasitic self-turn-on of the switch 8 due to Miller effect. The transition will end at the moment T5, when the diode 10 becomes forward biased. The resonant inductor 9 recirculates the resonant energy into the output capacitor 5 until the resonant current $I_R$ reaches zero at the moment T6. After the diode 10 becomes reverse biased at the moment T6, the voltage $V_2$ rings negative causing very large peak voltage across the diode 10 (See FIG. 2, dotted line 24). The diode 17 will prevent the capacitance 11 from discharging into the resonant inductor 9 at this moment. The techniques to damp this ringing were discussed very extensively in the prior art. Therefore, they will not be discussed here, and the damping means are missing from the FIG. 1 for the sake of simplicity.

Thus, there is a need in a circuit that would overcome the problem of increased power losses in the auxiliary switch 8, reduce the resonant current circulation and the minimum output voltage necessary to reset the resonant inductor 9 to zero current.

SUMMARY OF THE INVENTION

Accordingly, the primary object of the present invention is to provide a DC-to-DC converter family, holding the assets of prior art structures, would not be a subject to their drawbacks.

Another object of the invention is to propose an active snubber circuit providing zero voltage switching of a power switch and producing substantially reduced switching and conduction power loss within itself.

The present invention incorporates an active multi-resonant snubber circuit into a family of DC-to-DC converters. Presence of the active multi-resonant snubber circuit in the DC-to-DC converters allows to achieve lossless zero-voltage switching of the power switching means, reduce resonant energy circulation, minimize switching power losses. The invention allows to reduce the attainable minimum duty cycle necessary to reset the active snubber. The invention permits increased switching frequency of the DC-to-DC converters, reduced size of passive components and reduced power rating of active snubber components.

According to the present invention, there is provided a family of DC-to-DC converters for converting voltage from an input DC voltage source to an output DC voltage for delivery electrical energy to the load. The DC-to-DC converters comprise a power inductor being an energy storage device; an power controlled switching means periodically biased conducting for connecting the power inductor to the input DC voltage source and storing energy from the input DC voltage source in the power inductor; a power rectifier biased conducting for delivery of the energy stored in the power inductor to the load; an output filter capacitor connected across the output load for absorbing AC component of the output current; a multi-resonant active snubber circuit for reducing switching power loss in the power controlled switching means and the power rectifier.

The multi-resonant active snubber circuit comprises a first resonant capacitor in parallel with the power controlled switching means; a body diode connected in parallel with the power controlled switching means; a resonant inductor; an auxiliary controlled switching means being periodically biased conducting to couple the resonant inductor across the power controlled switching means; an auxiliary diode connected in series with the auxiliary controlled switching means; a second resonant capacitor; a first rectifier switching means coupling the second resonant capacitor across the resonant inductor; a second rectifier switching means coupling the second resonant capacitor across the output filter capacitor or the input DC voltage source via the power controlled switching means. The auxiliary controlled switching means is periodically biased conducting to obtain a zero voltage condition across the power controlled switching means and, thereby, ensures a lossless turn-on transition of the power controlled switching means. The second resonant capacitor absorbs the energy stored in the resonant inductor when the auxiliary controlled switching means is biased non-conducting and creates a zero voltage transition thereacross to minimize switching power loss. The second resonant capacitor diverts the current from the power controlled switching means to the output filter capacitor or the input DC voltage source via the second rectifier switching means when the power controlled switching means is biased non-conducting, thus, creating zero-voltage condition thereacross.

The first resonant capacitor is naturally provided by an output parasitic capacitance of the power controlled switching means.

The power controlled switching means is a power switching MOSFET.

The body diode is a built-in body diode of the power controlled switching means.

The auxiliary controlled switching means is also a power MOSFET.

The power, first and second rectifier switching means are switching rectifier diodes.

In another aspect of the present invention, a method is provided of reducing power loss in a DC-to-DC converter by means of a multi-resonant active snubber circuit described above. The method comprises the steps of:

switching on the auxiliary controlled switching means at zero current;

recovering the power rectifier in a soft way by diverting the current from the power rectifier to the resonant inductor;

discharging the first resonant capacitor in a resonant way by storing its energy in the resonant inductor;

switching on the power controlled switching means at zero voltage;

switching off the auxiliary controlled switching means at zero voltage while the second resonant capacitor is discharged;

resetting the resonant inductor to zero current in a resonant way by storing the energy in the second resonant capacitor;

switching off the power controlled switching means at zero voltage while the first resonant capacitor is discharged and the second resonant capacitor is fully charged;

charging the first resonant capacitor and discharging the second resonant capacitor recirculating the resonant energy in the output load or the input DC voltage source.

BRIEF DESCRIPTION OF THE DRAWINGS

For a better understanding of the nature and the foregoing and other objects and advantages of the present invention, reference should now be furnished to the ensuing detailed description. In the description, reference is made to the accompanying drawings which form a part thereof and in which, by way of illustration, there is shown a preferred embodiment of the invention, FIG. 1 being a circuit diagram of a prior art active resonant snubber circuit as it is utilized in a DC-to-DC converter of a boost topology.

DETAILED DESCRIPTION OF THE PREFERRED EMBODIMENT

Figure 1:
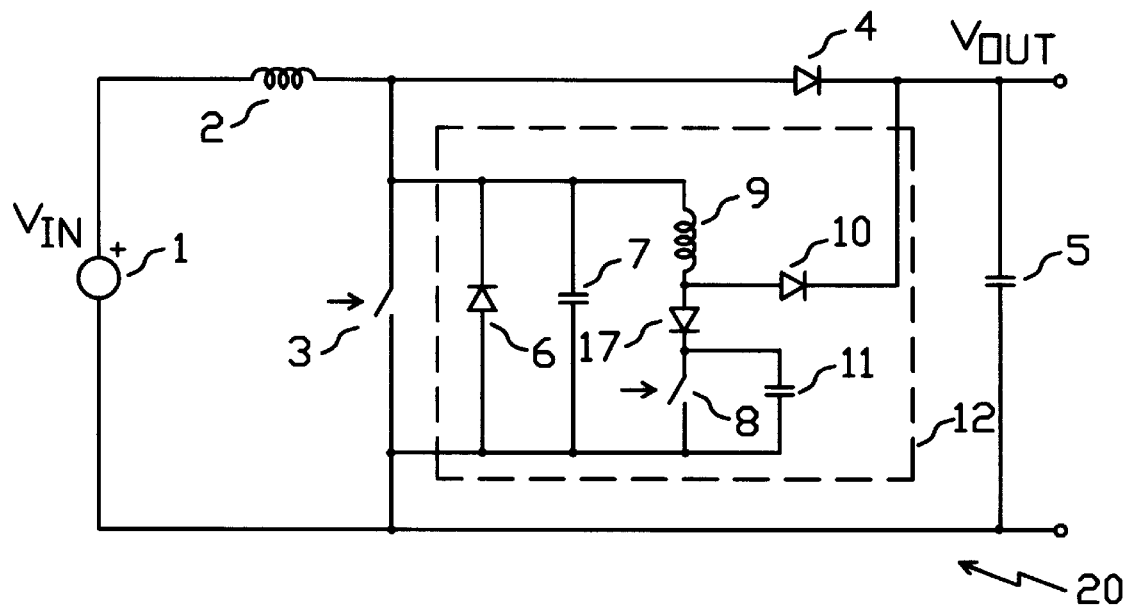
Figure 2:
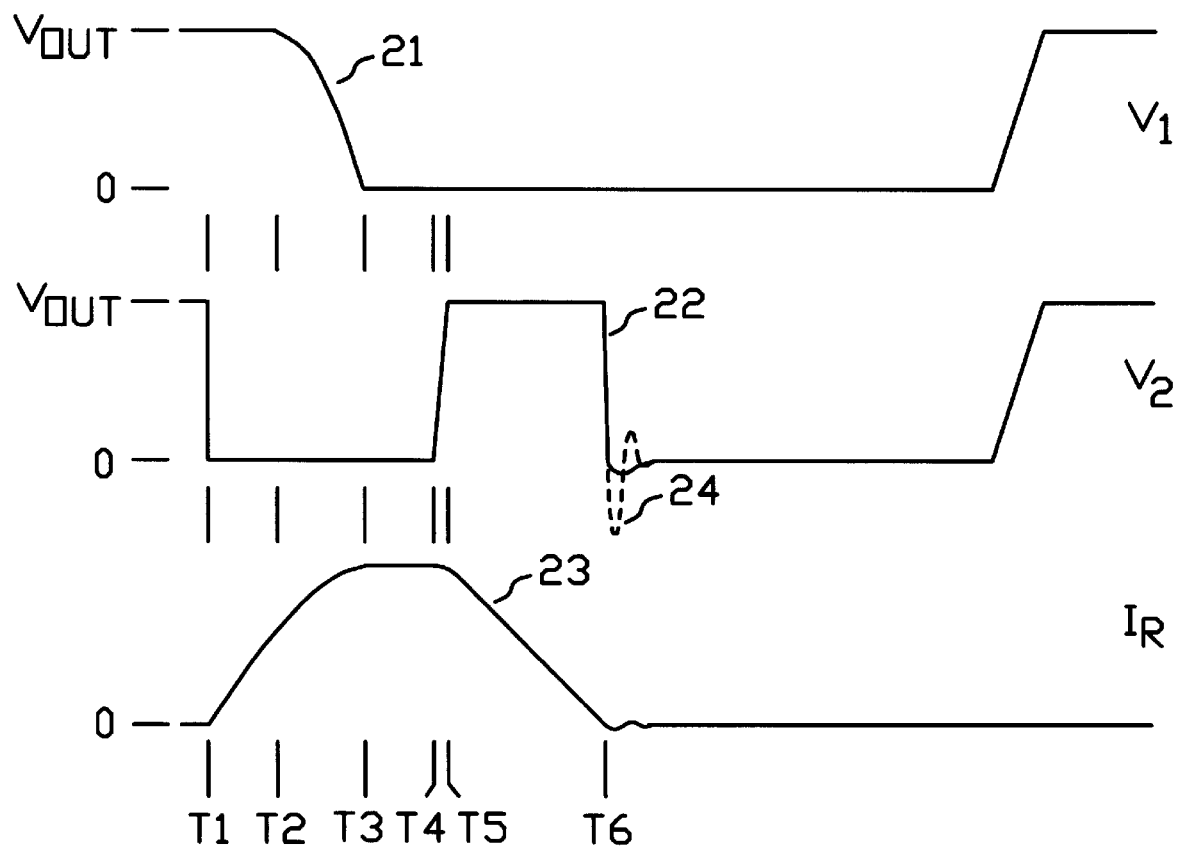
FIG. 2 presenting a diagram of the voltage $V_i$ 21 across the power controlled switch 3, the voltage $V_2$ 22 across the auxiliary controlled switch 8 and the diode 17 connected in series, the current $I_R$ 23 in the resonant inductor 9 waveforms of the circuit of FIG. 1.
Figure 3A:
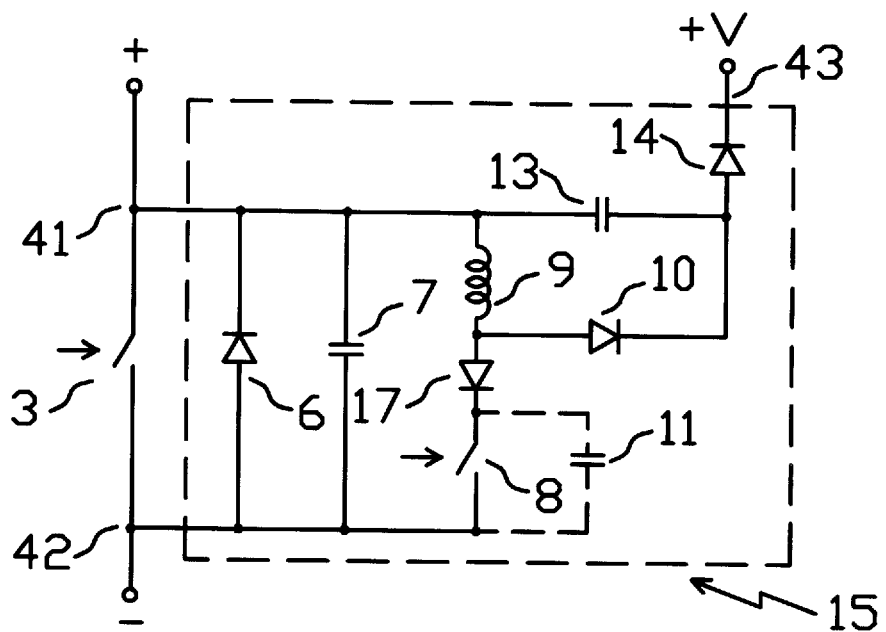
FIG. 3A and FIG. 3B depicting circuit diagrams of multi-resonant active snubber circuits embodying the principles of the present invention.
Figure 3B:
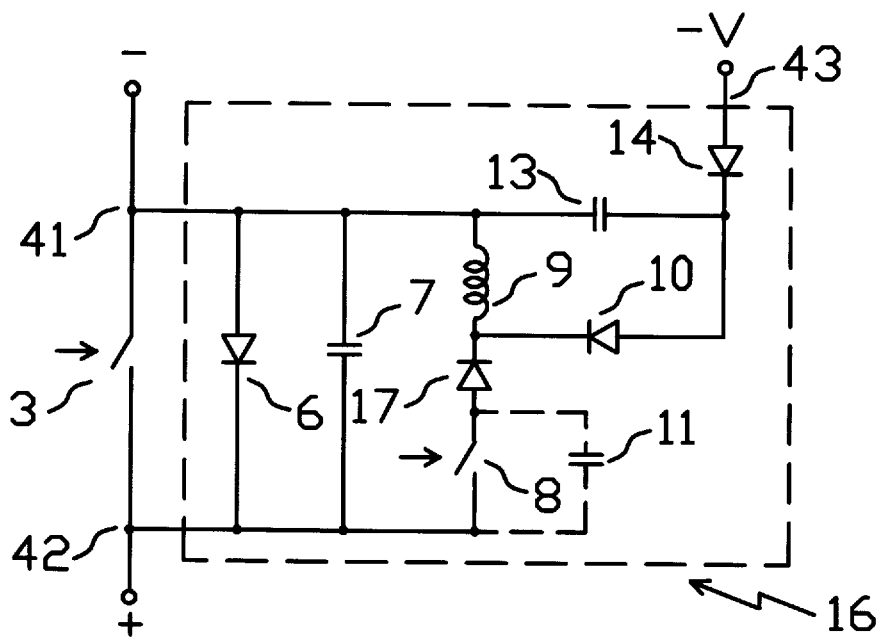

Multi-resonant active snubber networks 15 and 16 in accordance with the principles of the present invention are schematically shown in FIG. 3. The circuit 15 represents an active snubber network of the present invention with a common negative terminal 42. The circuit 16 depicts a similar arrangement with a common positive terminal 42. The snubber networks 15, 16 comprise input terminals 41, 42 and an output terminal 43. The input terminals 41, 42 are connected across a power switch 3. The output terminal 43 is connected to a DC voltage source (not shown). A diode 6 is connected across the power switch 3 and represents a built-in body diode of the power switch 3. A first resonant capacitor 7 in parallel with the power switch 3 represents parasitic output capacitance of the switch 3. A resonant inductor 9 is selectively connected in parallel with the power switch 3 via an auxiliary controlled solid-state switch 8. A diode 17 is connected in series with the auxiliary switch 8. A second resonant capacitor 13 is coupled in parallel with the resonant inductor 9 via a diode 10. A diode 14 couples the second resonant capacitor 13 to the output terminal 43. The capacitor 11 coupled in parallel with the switch 8 represents parasitic capacitance of the auxiliary switch 8. It is shown in dotted lines since its presence is not essential for the preferred embodiment of the present invention. However, its effect on the performance of the circuit has to be considered.

Figure 4A:
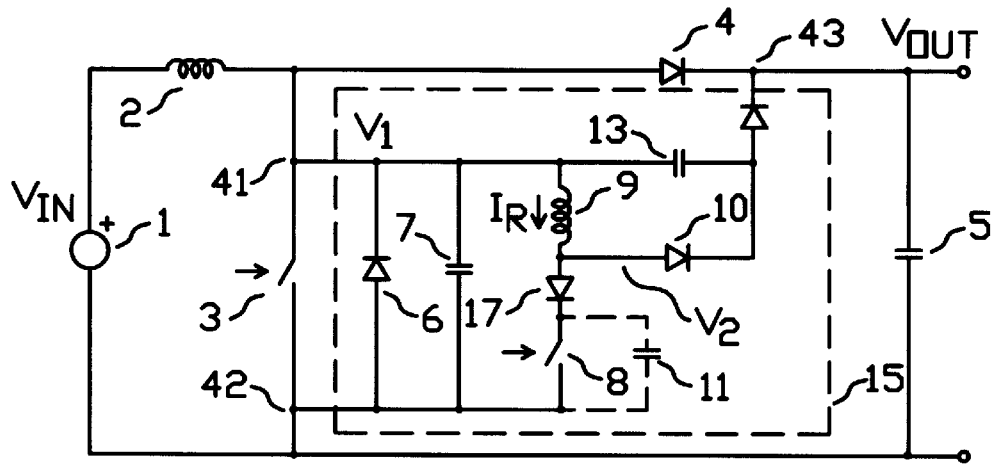
FIG. 4A, FIG. 4B and FIG. 4C representing circuit diagrams of DC-to-DC converters of boost 31, buck 32 and buck-boost 33 topologies employing the circuits of FIG. 3A and FIG. 3B.
Figure 4B:
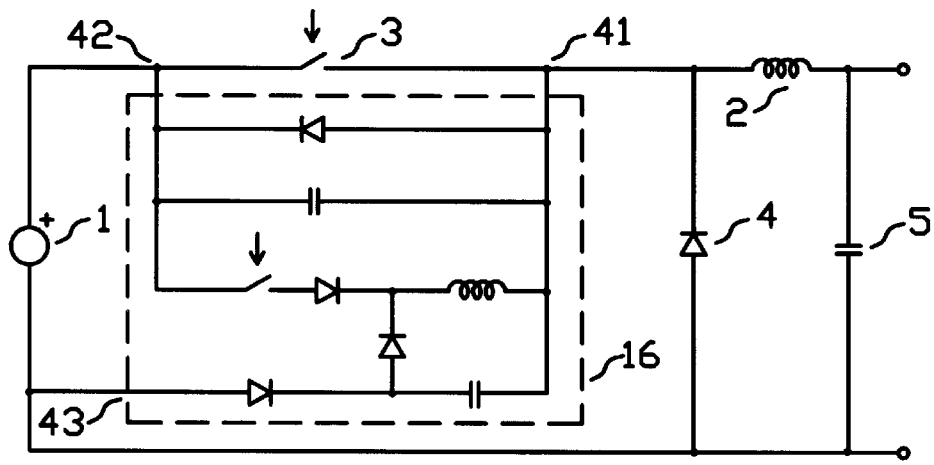
Figure 4C:
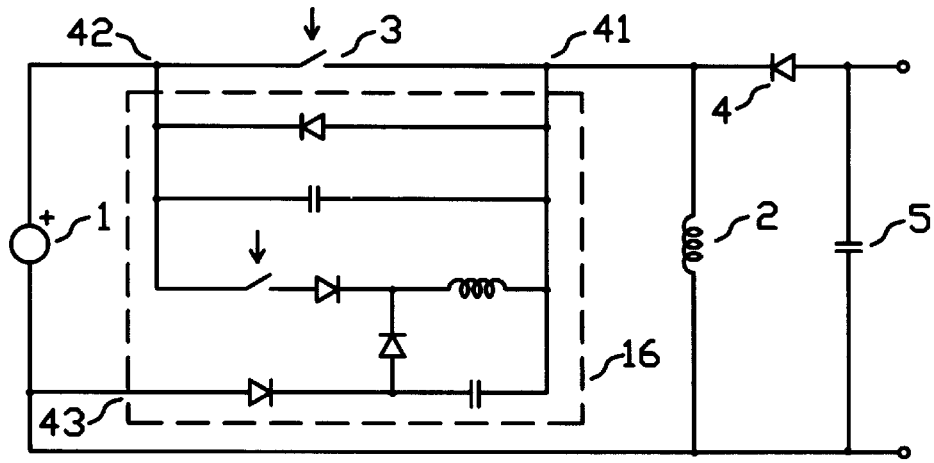

FIG. 4A, FIG. 4B and FIG. 4C illustrate the active snubber network 15 utilization in a boost converter 31, and the network 16 utilization in a buck converter 32 and a buck-boost converter 33. In the converter 31, the output terminal 43 of the active snubber circuit 15 is coupled into the positive terminal of the output capacitor 5. In the converters 32, 33 the output terminal 43 of the active snubber circuit 16 is coupled into a negative terminal of the input DC voltage source 1.

It is here to be understood that possible applications of the snubber networks 15, 16 are not limited to the converters 31, 32, 33 of FIG. 4A, FIG. 4B and FIG. 4C. The circuit diagrams of FIG. 4 are provided to illustrate the utilization principles of the snubber networks 15, 16 of the invention. Since operation the circuits 15, 16 is substantially identical in all applications, it will be described using the boost converter 31 as an example.

In the boost converter 31 of FIG. 4A, an input DC voltage source 1 is selectively connected to an inductor 2 via a controlled solid state switch 3. A power diode 4 in series with an output filter capacitor 5 is connected in parallel with the switch 3. An output load (not shown) is connected across the output filter capacitor 5. The multi-resonant active snubber network 15 described above is coupled in parallel with the power switch 3 with its input terminals 41, 42, the common terminal 42 being connected to the negative terminal of the input DC voltage source 1. The output terminal 43 of the snubber network 15 is coupled into the positive terminal of the output filter capacitor 5.

Due to the presence of the active snubber network 15 in the converter 31 topology, the controlled power switch 3 exhibits zero voltage transitions with very low switching loss. Zero-voltage turn-on transition of the power switch 3 is achieved by resonant discharging the parasitic capacitance 7 of the switch 3 and storing its energy in the resonant inductor 9 prior to the turn-on transition in the switch 3. This energy is further utilized to achieve lossless turn-off transition in the switch 3 by adding a second resonant capacitor 13. Adding the capacitor 13 also allows to achieve lossless zero-voltage turn-off transition in the auxiliary switch 8 of the snubber network 15. Due to soft resonant transitions the topology also features low reverse recovery power loss in the rectifier diodes 4, 10, 14.

Figure 5:
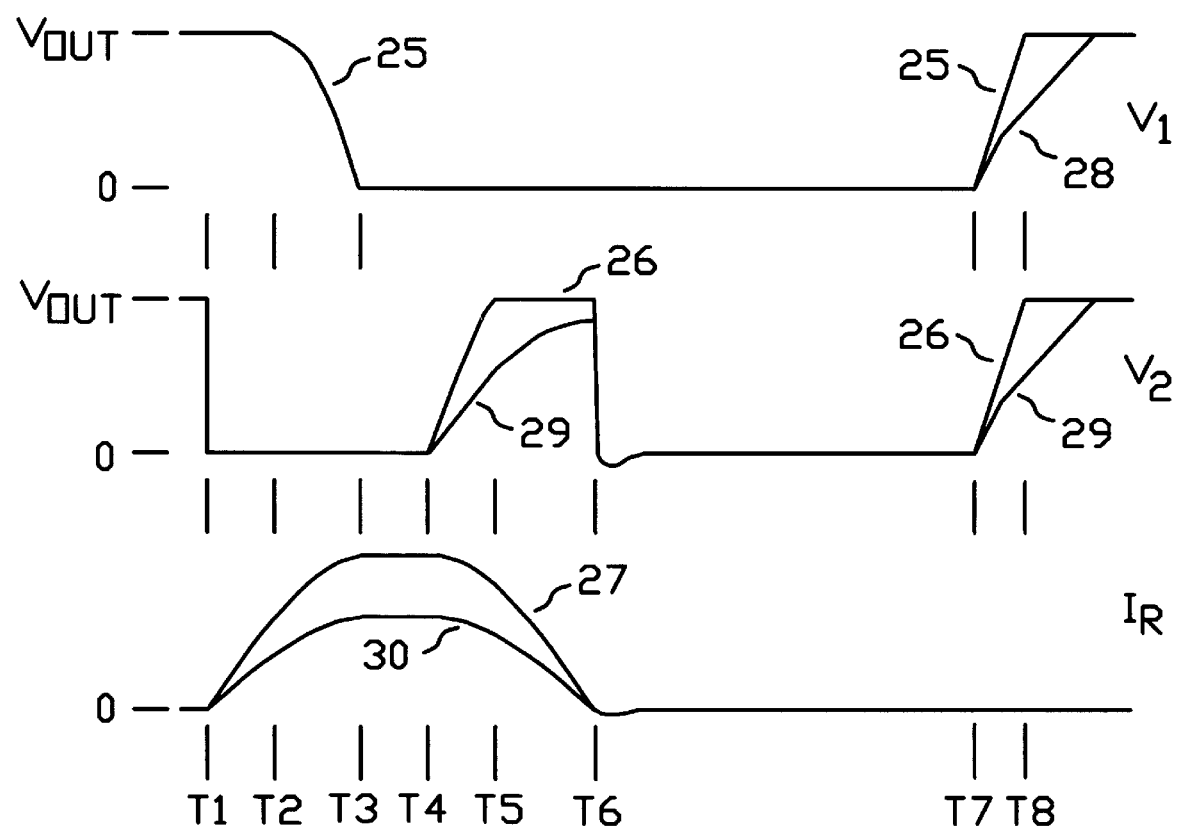
FIG. 5 illustrating voltage and current waveforms of the converter 31 of FIG. 4A explaining advantages of the circuits of FIG. 3A and FIG. 3B.

The waveforms of FIG. 5 illustrate main operating principles of the proposed topology. During a power transfer stage preceding the moment T1, the diode 4 is forward biased conducting the current of the boost inductor 2 from the input DC voltage source 1 to the load. The first resonant capacitor 7 is fully charged to the output voltage $V_{OUT}$ across the output filter capacitor 5. The second resonant capacitor 13 is fully discharged. The current $I_R$ in the resonant inductor 9 is zero. The power switch 3 and the auxiliary switch 8 are non-conductive. The parasitic output capacitance 11 of the switch 8 is fully charged to the output voltage $V_{OUT}$.

As soon as the auxiliary switch 8 is turned on at the moment T1, the voltage across the resonant inductor 9 becomes equal to the output voltage $V_{OUT}$. This voltage gives rise to a linear increase of the current $I_R$ in the resonant inductor 9 diverting the current from the boost diode 4 and providing its soft reverse recovery. The turn-on transition in the switch 8 occurs at zero current. Therefore, the switching power losses in the switch 8 during this transition are limited to the energy stored in the parasitic capacitance 11 of the switch 8. The voltage $V_1$ across the power switch 3 remains clamped to $V_{OUT}$ until, at the moment T2, the current $I_R$ in the resonant inductor 9 exceeds a sum of the current in the boost inductor 2 and the reverse recovery current in the diode 4. Numeral 27 designates a waveform for the resonant inductor current $I_R$ during the stage under discussion.

Starting the moment T2, the voltage $V_1$ across the power switch 3 (waveform 26 in FIG. 5) decreases in a sinusoidal way, while the capacitor 7 is being discharged resonantly. It continues until, at the moment T3, the body diode 6 of the power switch 3 becomes forward biased. At this moment, the resonant inductor 9 current $I_R$ enters a free-wheeling stage at its maximum value, since the inductor 9 becomes effectively shorted via the diode 6 and the auxiliary switch 8. Following the moment T3, the power switch will be biased conducting at zero voltage at any time inasmuch as the current finds its way through the body diode 6.

The next operational period T3–T4 is characterized by a rather high and nearly constant current $I_R$ circulating in the resonant inductor 9, the body diode 6 and auxiliary switch 8. To avoid excessive conduction power loss in this devices the duration of this period should be minimized.

At the moment T4, the auxiliary switch 8 is turned off. The diode 10 becomes forward biased diverting the resonant inductor 9 current $I_R$ into a fully discharged resonant capacitor 13. The value of the capacitor 13 is selected substantial enough to ensure lossless zero-voltage turn-off transition in the switch 8. The following operational period T4–T5 is characterized by a sinusoidal increase of the voltage $V_2$ across the auxiliary switch 8 (waveform 26 of FIG. 5) due to resonant charging of the capacitor 13. Starting this moment, two basic modes of operation can be determined based on the relation between the peak resonant current $I_{R(PK)}$ (as defined by the equation (1)) and the impedance of the second resonant tank $(L_R/C_{R2})^{1/2}$, where $L_R$ is a value of the resonant inductor 9, $C_{R2}$ is a value of the resonant capacitor 13.

The first mode is characterized by the condition of $I_{R(PK)}(L_R/C_{R2})^{1/2} > V_{OUT}$: if this condition is satisfied, the capacitor 13 is charged resonantly by the inductor 9 current $I_R$ until, at the moment T5, the diode 14 becomes forward biased. The voltage $V_2$ across the auxiliary switch 8 becomes clamped to the output voltage $V_{OUT}$ (waveform 26 of FIG. 5). During the next operational stage T5–T6 the current $I_R$ in the resonant inductor 9 is linearly reset to zero (waveform 27 of the FIG. 5), and the reminder of the resonant energy of the inductor 9 is recirculated in the output load. The first operational mode characterizes relatively high input current conditions of operation.

The second mode corresponds to the $I_{R(PK)}(L_R/C_{R2})^{1/2} \leq V_{OUT}$ condition: when this condition is satisfied, the moment T5 is never reached, and the operational period T5–T6 is not existent. At the moment T6, the voltage $V_2$ across the auxiliary switch 8 reaches its peak value (waveform 29 of FIG. 5), while the current $I_R$ in the resonant inductor 9 is resonantly reset to zero (waveform 30 of FIG. 5). This mode of operation occurs at low input current condition. It should be noted that the time scales of the waveforms 26, 27 and the waveforms 29, 30 are not the same. In FIG. 5, they were adjusted to preserve the operational stage sequence.

As it was mentioned before, after the current $I_R$ in the resonant inductor 9 crosses zero at the moment T6, the voltage $V_2$ rings negative causing substantial reverse voltage across the diode 10. The diode 17 will prevent the parasitic capacitance 11 of the switch 8 from discharging into the resonant inductor 9 following this moment. However, if not damped, this ringing may cause a voltage spike exceeding several times the output voltage $V_{OUT}$. The techniques to damp this ringing were extensively discussed in the prior art. Therefore, they are out of the scope of this description, and the damping means are missing from FIG. 3 and FIG. 4. However, the voltage $V_2$ waveform 26 of FIG. 5 represents damped behaviour following the moment T6.

During the next operational period T6–T7, the energy from the input DC voltage source 1 is stored in the boost inductor 2 via the conducting power switch 3. The energy storing cycle ends at the moment T7, when the power switch 3 is turned off. At high input current the capacitor 13 is fully charged to the output voltage $V_{OUT}$. Therefore, the inductor 2 current is diverted from the power switch 3 into the capacitor 13 via the diode 14 and into the fully discharged capacitor 7. The value of the capacitor 13 is selected to be large enough to ensure lossless zero-voltage turn-off of the power switch 3.

Starting the moment T7, the boost inductor 2 current gives rise to a linear increase of the voltage $V_1$ across the power switch 3 (waveform 25 of FIG. 5), while the capacitor 7 is charged to the output voltage $V_{OUT}$ and the capacitor 13 is discharged to zero. If the capacitor 13 was not fully charged to $V_{OUT}$ during the stage T4–T6 (second mode of operation), the voltage $V_1$ slew rate will be defined by the value of the capacitor 7 until the diode 14 becomes forward biased (waveform 28 of FIG. 5). However, since this mode of operation corresponds to the low input current condition, the value of the parasitic output capacitance 7 of the power switch 3 is quite sufficient to provide lossless turn-off transition in the switch 3. This stage of operation ends at the moment T8, when the diode 4 becomes forward biased conducting the boost inductor 2 current to the output load.

It can be noted that, unlike the prior art, the circuit does not require any additional capacitance across the power switch 3 to achieve lossless turn-off transition in the switch 3. Therefore, the resonant current circulation in the active snubber circuit 15 becomes substantially smaller which allows to reduce substantially conduction power losses in the snubber circuit 15 itself. This fact also allows to reduce the minimum duty cycle $D_{min}$ of the converter 31 (and, therefore, the minimum output voltage $V_{OUT(min)}$) necessary to reset the resonant inductor 9 to zero current.

Since the operating principles of the active snubber network 16 are substantially identical to the ones of the network 15, they will not be discussed in the preferred embodiment description.

In view of the above discussion of the multi-resonant active snubber network, it can be appreciated that introducing this network in a family of DC-to-DC converters allows to obtain lossless transitions in the power switching devices, increase switching frequency and reduce power dissipation in the converter. Introducing a second resonant path in the active snubber network also allows to minimize switching and conduction power losses within the snubber network itself. It results in reduced resonant current circulation and lossless zero-voltage turn-off transitions in the auxiliary switching means utilized in the snubber circuit. It also permits operation of the DC-to-DC converter at reduced minimum duty cycle.

While limited embodiment only of the present invention has been disclosed hereinabove, it is to be understood that this embodiment is given by an example only and not in a limiting sense. Those skilled in the art may make various modifications and additions to the preferred embodiment chosen to illustrate the invention without departing from the spirit and the scope of the present contribution to the art.

Accordingly, it is to be realized that the patent protection sought and to be afforded hereby shall be deemed to extend to the subject matter claimed and all equivalence thereof fairly within the scope of the invention.

What is claimed is:

1. A family of switching type DC-to-DC converters for converting voltage from an input DC voltage source to an output DC voltage for delivery electrical energy to an output load, said converters comprising:

an input adapted to receive electrical energy from said input DC voltage source;

an output adapted to deliver electrical energy to said output load;

an energy storage inductor adapted to store energy from said input DC voltage source and deliver said energy to said output load;

a controlled power switching means periodically biased conducting for connecting said energy storage inductor to said input DC voltage source;

a power rectifier biased conducting for connecting said energy storage inductor to said output load during intervals when said controlled power switching means is biased non-conducting;

an output filter capacitor adapted to be connected to said output load to absorb an AC component of the output current;

an active snubber network connected across said controlled power switching means;

said active snubber network including a first resonant capacitor, a body diode, a resonant inductor; a controlled auxiliary switching means, a first diode, a second resonant capacitor and a second diode;

said first resonant capacitor connected across said controlled power switching means;

said body diode connected across said controlled power switching means to provide a reverse current path thereacross;

said resonant inductor connected in series with said controlled auxiliary switching means and coupled across said first resonant capacitor;

said controlled auxiliary switching means biased conducting at zero current to provide resonant discharge of said first resonant capacitor prior to said controlled power switching means being biased conducting, therefore facilitating its zero-voltage turn-on;

said first diode connected in series with said second resonant capacitor and coupled across said resonant inductor to clamp the voltage across said controlled auxiliary switching means at zero and facilitate its lossless turn-off;

said second resonant capacitor adapted to absorb the resonant energy stored in said resonant inductor;

said second diode connected in series with said second resonant capacitor and adapted to limit the voltage across said second resonant capacitor during its resonant charging;

said second diode adapted to provide a discharge path for said second resonant capacitor when said controlled power switching means is biased non-conducting and to facilitate its lossless zero-voltage turn-off.

2. The converters as claimed in claim 1, wherein said second diode is connected to said output load to recirculate the resonant energy stored in said resonant inductor and said second resonant capacitor.

3. The converters as claimed in claim 1, wherein said second diode is connected to said input DC voltage source to recirculate the resonant energy stored in said resonant inductor and said second resonant capacitor.

4. The converters as claimed in claim 1, wherein said second diode is connected to an intermediate capacitor to recirculate the resonant energy stored in said resonant inductor and said second resonant capacitor into said output load or said input DC voltage source.

5. The converters as claimed in claim 1, wherein said controlled power switching means and said controlled auxiliary switching means are connected to the positive terminal of said input DC voltage source.

6. The converters as claimed in claim 1, wherein said controlled power switching means and said controlled auxiliary switching means are connected to the negative terminal of said input DC voltage source.

7. The converters as claimed in claim 1, wherein said body diode is a built-in body diode of said controlled power switching means.

8. The converters as claimed in claim 1, wherein said first resonant capacitor is naturally supplied by an output capacitance of said controlled power switching means.

9. The converters as claimed in claim 1, wherein a diode is added in series with said auxiliary switching means to prevent discharging of parasitic output capacitance of said auxiliary switching means into said resonant inductor from occurring after the current in said resonant inductor crosses zero.

10. A multi-resonant active snubber network for achieving lossless zero-voltage switching of a controlled solid-state switching device and recirculating electrical energy stored in the parasitic elements of said controlled solid-state switching device; said multi-resonant active snubber circuit including:

a first resonant capacitor connected across said controlled solid-state switching device;

a body diode connected across said controlled solid-state switching device to provide a reverse current path thereacross;

a resonant inductor connected in series with a controlled auxiliary switching means and coupled across said first resonant capacitor;

said controlled auxiliary switching means biased conducting at zero current to provide resonant discharge of said first resonant capacitor prior to said controlled solid-state switching device being biased conducting, therefore facilitating its zero-voltage turn-on;

a first diode connected in series with a second resonant capacitor and coupled across said resonant inductor to clamp the voltage across said controlled auxiliary switching means at zero and facilitate its lossless turn-off;

said second resonant capacitor adapted to absorb the resonant energy stored in said resonant inductor;

a second diode connected in series with said second resonant capacitor and adapted to limit the voltage across said second resonant capacitor during its resonant charging;

said second diode adapted to provide a discharge path for said second resonant capacitor into an external DC voltage source when said controlled solid-state switching device is biased non-conducting and to facilitate its lossless zero-voltage turn-off;

said external DC voltage source adapted to be referenced to one of the terminals of said controlled solid-state switching device.

11. The snubber network as claimed in claim 10, wherein said body diode is a built-in body diode of said controlled solid-state switching device.

12. The snubber network as claimed in claim 10, wherein said first resonant capacitor is naturally supplied by an output capacitance of said controlled solid-state switching device.

13. The snubber network as claimed in claim 10, wherein a diode is added in series with said auxiliary switching means to prevent discharging of parasitic output capacitance of said auxiliary switching means into said resonant inductor from occurring after the current in said resonant inductor crosses zero.

14. A method of converting a DC input into a DC output voltage in a family of switching type DC-to-DC converters comprising an energy storage inductor; a controlled power switching means for connecting said energy storage inductor to said input DC voltage; a power rectifier for connecting said energy storage inductor to an output load; an output filter capacitor connected to said output load to absorb an AC component of the output current; an active snubber network connected across said controlled power switching means; said active snubber network including a first resonant capacitor, a body diode, a resonant inductor; a controlled auxiliary switching means, a first diode, a second resonant capacitor and a second diode; said first resonant capacitor connected across said controlled power switching means; said body diode connected across said controlled power switching means to provide a reverse current path thereacross; said resonant inductor connected in series with said controlled auxiliary switching means and coupled across said first resonant capacitor; said first diode connected in series with said second resonant capacitor and coupled across said resonant inductor; second diode connected in series with said second resonant capacitor and adapted to limit the voltage across second resonant capacitor during its resonant charging; said second diode adapted to provide a discharge path for said second resonant capacitor; said method comprising the steps of:

(a) zero-current switching on said auxiliary switching means while said controlled power switching means is off, thus causing said first resonant capacitor to discharge into said resonant inductor, facilitating soft reverse recovery of said power rectifier and providing zero-voltage condition across said controlled power switching means;

(b) zero-voltage switching on said controlled power switching means;

(c) zero-voltage switching off said auxiliary switching means, thus causing said resonant inductor to discharge into said second resonant capacitor until said second diode is biased conducting;

(d) resetting the current in said resonant inductor to zero;

(e) charging said energy storage inductor from said input DC voltage via said controlled power switching means;

(f) zero-voltage switching off said controlled power switching means;

(g) linear discharging said second resonant capacitor via said second diode and charging said first resonant capacitor;

(h) forward biasing said power rectifier for discharging said energy storage inductor into said output load.

15. A method as claimed in claim 14, wherein said second resonant capacitor is discharged via said second diode into said input DC voltage source to recirculate the resonant energy stored in said second resonant capacitor.

16. A method as claimed in claim 14, wherein said second resonant capacitor is discharged via said second diode into said output load to recirculate the resonant energy stored in said second resonant capacitor.

17. A method as claimed in claim 14, wherein said second resonant capacitor is discharged via said second diode into an intermediate capacitor to recirculate the resonant energy stored in said second resonant capacitor into said output load or said input DC voltage source.

18. A method of providing lossless zero voltage switching of a controlled solid-state switching device by utilizing a multi-resonant active snubber network connected across said controlled solid-state switching device; said multi-resonant active snubber network including a first resonant capacitor, a body diode, a resonant inductor; a controlled auxiliary switching means, a first diode, a second resonant capacitor and a second diode; said first resonant capacitor connected across said controlled solid-state switching device; said body diode connected across said controlled solid-state switching device to provide a reverse current path thereacross; said resonant inductor connected in series with said controlled auxiliary switching means and coupled across said first resonant capacitor; said first diode connected in series with said second resonant capacitor and coupled across said resonant inductor; second diode connected in series with said second resonant capacitor and adapted to limit the voltage across second resonant capacitor during its resonant charging; said second diode adapted to provide a discharge path for said second resonant capacitor into an external DC voltage source; said external DC voltage source adapted to be referenced to one of the terminals of said controlled solid-state switching device; said method comprising the steps of:

(a) zero-current switching on said auxiliary switching means while said controlled solid-state switching device is off, thus causing said first resonant capacitor to discharge into said resonant inductor providing zero-voltage condition across said controlled solid-state switching device;

(b) zero-voltage switching on said controlled solid-state switching device;

(c) zero-voltage switching off said auxiliary switching means, thus causing said resonant inductor to discharge into said second resonant capacitor until said second diode is biased conducting;

(d) resetting the current in said resonant inductor to zero;

(e) zero-voltage switching off said controlled solid-state switching device;

(f) linear discharging said second resonant capacitor via said second diode into said external DC voltage source and charging said first resonant capacitor.

* * * * *